(12) United States Patent
Seok et al.

(10) Patent No.: US 6,853,060 B1
(45) Date of Patent: Feb. 8, 2005

(54) SEMICONDUCTOR PACKAGE USING A PRINTED CIRCUIT BOARD AND A METHOD OF MANUFACTURING THE SAME

(75) Inventors: Jae Wook Seok, Seoul (KR); Kyu Won Lee, Seoul (KR); Yong Suk Yoo, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/420,977

(22) Filed: Apr. 22, 2003

(51) Int. Cl.[7] .......................... H01L 23/02; H01L 23/04; H01L 21/44

(52) U.S. Cl. ...................... 257/678; 257/698; 438/106

(58) Field of Search ................................ 257/700, 701, 257/773, 783, 786, 787

(56) References Cited

U.S. PATENT DOCUMENTS 6,531,766 B1 * 3/2003 Taniguchi ................... 257/678

* cited by examiner

Primary Examiner—Amir Zarabian
Assistant Examiner—Kiesha Rose
(74) Attorney, Agent, or Firm—Weiss, Moy & Harris, P.C.

(57) ABSTRACT

A semiconductor package has a substrate comprising a thermosetting resin layer of an approximate planar plate, a plurality of copper patterns formed at top and bottom surfaces of the resin layer, and protective layers coated on predetermined regions of the copper patterns and the thermosetting layer and having a same height at a surface of the resin layer. A semiconductor die is coupled to a center of the top surface of the substrate. A plurality of conductive wires for electrically coupling the semiconductor die to the copper patterns is positioned at the top surface of the resin layer. An encapsulant is used for covering the semiconductor die located at the top surface of the substrate and the conductive wires in order to protect them from the external environment. A plurality of solder balls is coupled to the bottom surface of the substrate.

20 Claims, 12 Drawing Sheets

SEMICONDUCTOR PACKAGE USING A PRINTED CIRCUIT BOARD AND A METHOD OF MANUFACTURING THE SAME

BACKGROUND OF THE INVENTION

1. Field of the Invention

This invention relates to semiconductor packages, and, more specifically, to a semiconductor package using a printed circuit board (PCB) and a method of manufacturing the aforementioned.

2. Description of the Related Art

Recently, semiconductor packages have started to use a PCB (Printed Circuit Board) instead of a conventional lead frame. The benefits of using a PCB include: lowering an inductance thereof, sharply improving the electrical capacity, providing a heat discharging capacity and providing a surface mounting capacity thereof.

The PCB used in the semiconductor packages includes a conventional thermosetting resin layer, a plurality of copper patterns at the top and bottom surfaces thereof, and a protective layer coated on the surfaces of the copper patterns.

Accordingly, there is a height difference between the existing portion and the nonexisting portion of the copper patterns. Also, the surface of the protective layer covering the copper patterns has a height difference. This height difference or the small winding makes the protective layer crack, owing to the pressure applied to the surfaces of the PCB during injection molding of an encapsulant for the plastic package. In a severe case, there is a chance that the electrically conductive patterns located on the inside of the protective layer can be cut.

Also, in a general sense, the protective layers are printed on the surfaces of the copper patterns several times during the printing process of the protective layer so that it makes the entire thickness of the PCB meet the standards. However, at this time, the rate of a bad semiconductor package that is due to a change of process condition such a mold gap, according to the change of process condition in the printing process of the protective layer, is increased.

Moreover, the protective layers are printed on the surfaces of the copper patterns several times, so that its thickness increases. Therefore, an air void between the copper patterns can easily occur during the printing process of the protective layer and in the following process, the air void also, is expanded, thereby lowering the reliance of the PCB.

Therefore a need existed to provide a semiconductor package and a method of producing a semiconductor package that overcomes the above problems.

A BRIEF SUMMARY OF THE INVENTION

A semiconductor package has a substrate comprising a thermosetting resin layer of an approximate planar plate, a plurality of copper patterns formed at top and bottom surfaces of the resin layer, and protective layers coated on predetermined regions of the copper patterns and the thermosetting layer and having a same height at a surface of the resin layer. A semiconductor die is coupled to a center of the top surface of the substrate. A plurality of conductive wires for electrically coupling the semiconductor die to the copper patterns is positioned at the top surface of the resin layer. An encapsulant is used for covering the semiconductor die located at the top surface of the substrate and the conductive wires in order to protect them from the external environment. A plurality of solder balls is coupled to the bottom surface of the substrate.

The present invention is best understood by reference to the following detailed description when read in conjunction with the accompanied drawings.

A BRIEF DESCRIPTION OF THE DRAWINGS

Common reference numerals are used throughout the drawings as well, detailed descriptions are used to indicate like elements.

A DETAILED DESCRIPTION OF THE INVENTION

Figure 1:
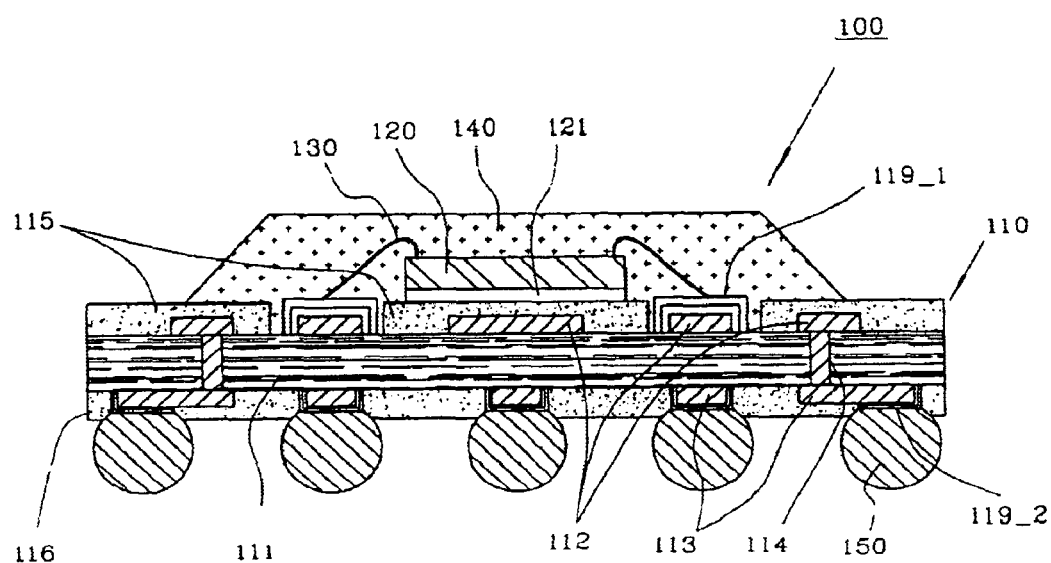
FIG. 1 is a sectional view of a semiconductor package according to one embodiment of the present invention.

Referring to FIG. 1, a sectional view of a semiconductor package 100 according to one embodiment of the present invention is illustrated.

As shown in the drawing, the semiconductor package 100 includes a substrate 110 of an approximate planar plate, a semiconductor die 120 bonded to the center of the top surface of the substrate 110, a plurality of conductive wires 130 for electrically connecting the semiconductor die 120 to the substrate 110, an encapsulant 140 for covering the semiconductor die 120 located at the top surface of the substrate 110 and the conductive wires 130, in order to protect them from the external environment, and a plurality of solder balls 150 fused, to the bottom surface of the substrate 110 that are mounted to the external device.

The substrate 110 includes a thermosetting resin layer 111 of an approximate planar plate, a plurality of copper patterns 112 formed at the top surface of the resin layer 111, a plurality of other copper patterns 113 formed at the bottom surface of the resin layer 111, a plurality of conductive via 114 for electrically connecting the electrically conductive patterns 112 to other electrically conductive patterns 113, a protective layer 115 for covering parts of the top surfaces of the copper patterns 112 and the resin layer 111, as well as another protective layer 116 covering parts of the bottom surfaces of the copper patterns 113 and the resin layer 111.

Here, a part of the copper pattern 112 electrically connected to the conductive wire 130 is referred to as a bond finger, as well a part of the copper pattern 113, to which the solder ball 150 is fused, is called as a ball land. Also, a nickel (Ni)/gold (Au) plating layer 119_1 is formed at the bond finger and another nickel (Ni)/gold (Au) plating layer 119_2 is formed at the ball land. The reason for forming plating layers 119_1 and 119_2, as described above, is that they are strongly connected and fused to the conductive wires 130 and the solder balls 150, respectively. Of course, the protective layers 115 and 116 do not cover the ball lands and the bond finger, in order to perform the wire bonding and the fusing process.

The protective layers 115 and 116 are formed in such a way that there is no difference in height of the protective layer between the regions of the resin layer 111, at which the copper patterns 112 and 113 are formed, and other regions of the resin layer 111, at which the copper patterns 112 and 113 are not formed. That is, the heights of the protective layers 115 and 116 for covering the copper patterns 112 and 113 of the resin layer 111, except for the bond fingers and the ball lands, are the same as those of the protective layers 115 and 116 for covering the top surfaces of the resin layer, at which the copper patterns 112 and 113 are not formed. In other words, all thickness between the thermosetting resin layer 111 and the exposed surface of the protective layers 115 and 116 is the same, so that the thickness of the protective layer is uniform. The protective layers 115 and 116 having the same height and the superior evenness are deemed workable by a grinding process, as described in detail herein below.

The semiconductor die 120 is bonded to the center of the top surface of the substrate 110 by means of an adhesive 121. The adhesive 121 may be a conventional epoxy, a tape, film or its equivalent. However, the present invention is not limited to any of the above mentioned adhesives. The copper patterns 112 are partially formed at the bottom surface of the semiconductor die 120. In addition, the protective layer 115 is coated on the surface of the copper patterns 112. Here, the height or the evenness of the protective layer 115 is the same at the surface of the resin layer 111, so that the semiconductor die 120 can be bonded to the surface of the protective layer 115 having a very delicate and even surface. Also, since the protective layer 115 of which has a good evenness is bonded to the bottom surface of the semiconductor die 120 by means of the adhesive 121, the bonding force between the semiconductor die 120 and the protective layer 115 becomes very strong.

The semiconductor die 120 and the bond fingers of the electrically conductive patterns 112 of the substrate 110 are electrically connected to each other by means of the conductive wires 130. The material of the conductive wire 130 may be a conventional gold wire, an aluminum wire or its equivalent. However, the present invention is not limited to any material of the conductive wire.

The encapsulant 140 covers the semiconductor die 120 located at the top surface of the substrate 110 and the conductive wires 130, so as to protect them from the external environment. As is generally known, the encapsulant 140 is formed in such a manner that the substrate 110 is located at the bottom and top molds having a cavity. This, in turn, is formed at a region corresponding to the semiconductor die 120 and the conductive wires 130 which presses down the top surface of the substrate 110 (the protective layer 115 located at the outside of the encapsulant 140) where then, the encapsulant of high temperature and pressure is injected into the cavity. At this time, since the protective layer 115 compressed by the top mold has an excellent even surface, the crack of the protective layer 115 or the crack of the copper pattern 112 located at the protective layer 115 does not occur.

The solder balls 150 are fused to the ball lands, which are exposed to the lower part of the substrate through the protective layer 116 formed at the bottom surface of the substrate 110. The solder balls 160 are surface-mounted to an external device in the future through a reflowing process, in order to electrically connect the signals of the semiconductor package 100 to the external device.

In the above embodiment of the present invention, only the substrate 110 has the same height of the protective layers 115 and 116 at the top and bottom surfaces of the resin layer 111. However, the protective layer 115 formed only on the top surface of the resin layer 111 may be the same height. That is, the height of the protective layer 116 formed at the bottom surface of the resin layer 111 does not need to be the same. Even if the height of the protective layer 116 formed at the bottom surface of the resin layer 111 is not the same, it has little significance. This is because the stress generated from the mold mainly influences the top surface of the resin layer 111, that is, the top surface of the substrate 110. Of course, such characteristic on the substrate, as described above, may be applied to all substrates as will be described later.

Figure 2A:
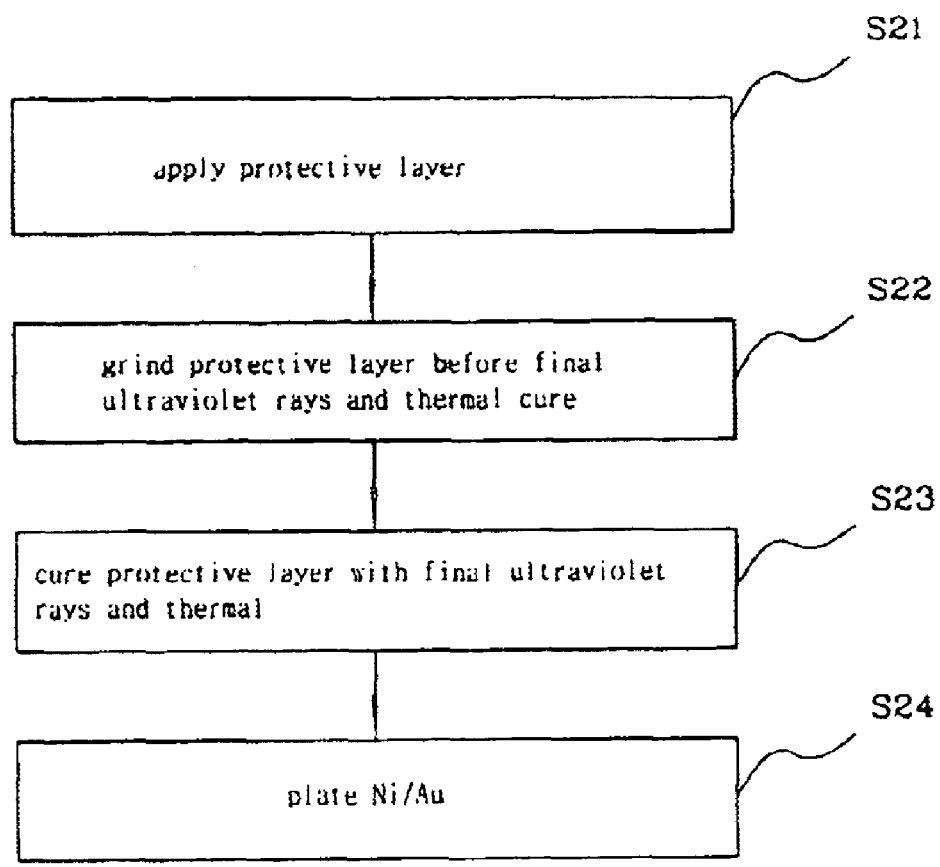
FIG. 2A is a flow chart showing one fabrication method of a printed circuit board for a semiconductor package according to one embodiment of the present invention.
Figure 2B:
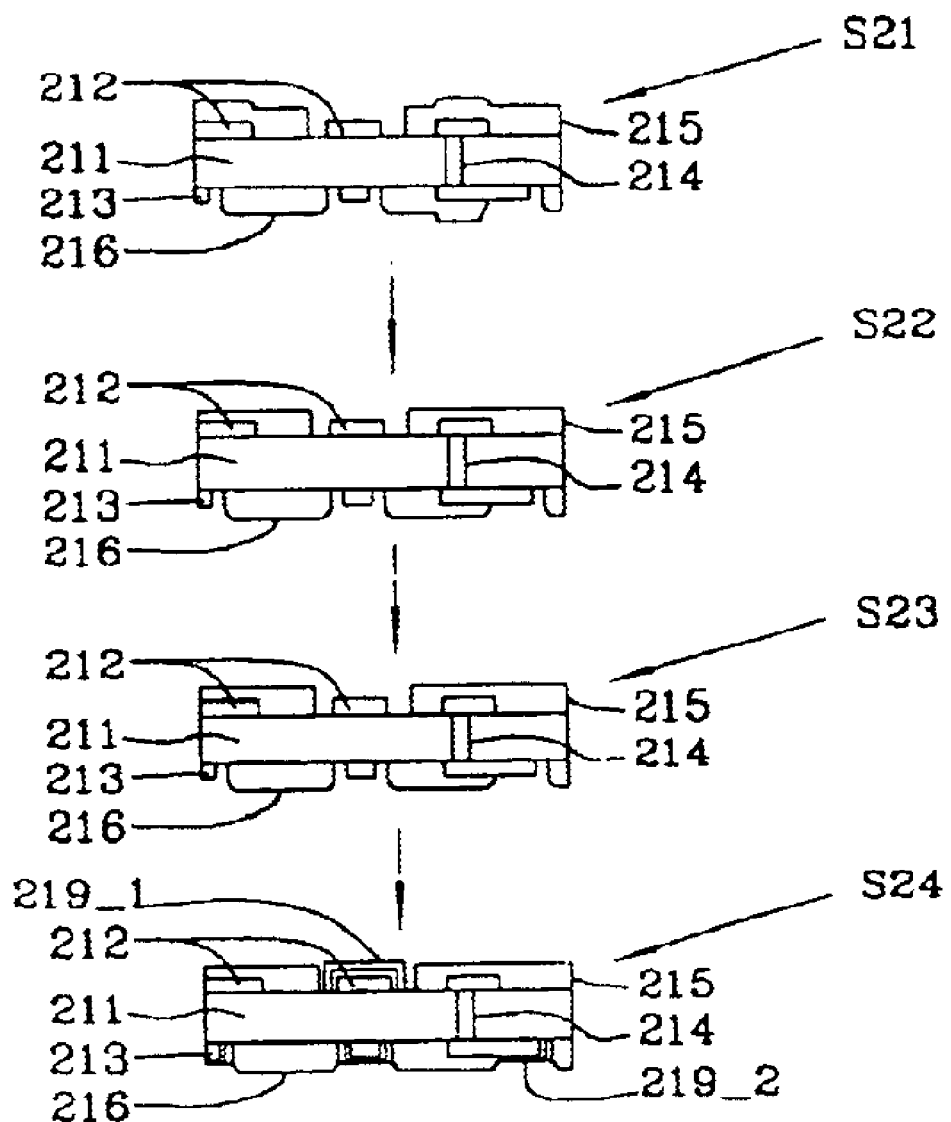
FIG. 2B is a schematic sectional view of the printed circuit board of FIG. 2A.

Referring to FIG. 2A, a flow chart showing one fabrication method of a printed circuit board for a semiconductor package according to one embodiment of the present invention is illustrated. Referring to FIG. 2B, a schematic sectional view of the printed circuit board of FIG. 2A is illustrated.

As shown in the drawings, a fabrication method includes protective layers 215 and 216 forming step S21, a grinding step S22, a final hardening step S23 of the protective layers 215 and 216, and nickel (Ni)/gold (Au) plating layers 219_1 and 219_forming step S24.

In the protective layers 215 and 216 forming step S21, the protective layers 215 and 216 of a predetermined quantity are coated on the entire top and bottom surfaces of a thermosetting resin layer 211 except for where the bond fingers and ball lands of copper patterns 212 and 213 are located. The protective layers 215 and 216 are coated after forming the conventional copper patterns 212 and 213 at top and bottom surfaces of the resin layer 211. Since the protective layers 215 and 216 are not formed on the entire surface of the resin layer 211, the protective layers are different in height. That is, the heights of the protective layers 212 and 213 vary according to the existence and nonexistence of the electrically conductive patterns 212 and 213.

Continuously, in the grinding step S22, the protective layers 215 and 216 are grinded by a brush, etc. in order to eliminate the projected portions of the protective layers 215 and 216. Here, the grinding process is carried out prior to the final hardening process of the protective layers 215 and 216. The copper patterns 212 and 213 located at the inside of the protective layers 215 and 216 should not be exposed to the outside. Accordingly, predetermined parts of protruded protective layers 215 and 216 are eliminated all together, thereby creating the protective layers 215 and 216 having a flat surface.

Successively, in the final hardening step S23 of the protective layers 215 and 216, the surfaces of protective layers 215 and 216 are irradiated by ultraviolet ray and heat. Accordingly, the protective layers 215 and 216 become completely hard, so that the copper patterns 212 and 213 located on the inside thereof can be protected from the external environment.

The grinding process can be carried out prior to a preliminary hardening process of the protective layers in that the protective layers 215 and 216 are irradiated by ultraviolet rays or prior to the final hardening process of the protective layers 215 and 216 in that the protective layers are finally hardened by applying heat.

Finally, in the nickel (Ni)/gold (Au) plating layers 219_1 and 219_2 forming step S24, the surfaces of the ball lands and the bond fingers, which are exposed to the outside through protective layers, are sequentially plated with nickel/gold (Ni/Au) (not shown).

Here, the height of the protective layer 215 may be the same only at the top surface of the resin layer 211 by means of the grinding process.

Figure 3:
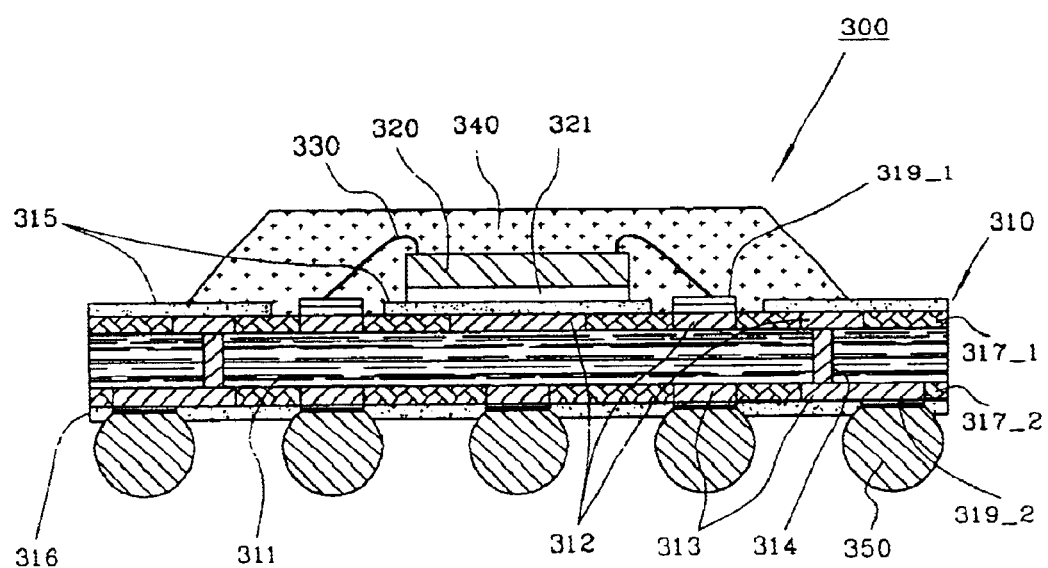
FIG. 3 is a sectional view of a semiconductor package according to another embodiment of the present invention.

Referring to FIG. 3, a sectional view of a semiconductor package 300 according to another embodiment of the present invention is illustrated.

As shown in FIG. 3, the semiconductor package 300 includes a substrate 310 of an approximate planar plate, a semiconductor die 320 bonded to the center of the top surface of the substrate 310, a plurality of conductive wires 330 for electrically connecting the semiconductor die 320 to the substrate 310, an encapsulant 340 for covering the semiconductor die 320 located at the top surface of the substrate 310 and the conductive wires 330 used in order to protect them from the external environment, and a plurality of solder balls 350 fused to the bottom surface of the substrate 310 and mounted to the external device.

The substrate 310 includes a thermosetting resin layer 311 of an approximate planar plate, a plurality of copper patterns 312 formed at the top surface of the resin layer 311, a plurality of other copper patterns 313 formed at the bottom surface of the resin layer 311, a plurality of conductive via 314 for electrically connecting the electrically conductive patterns 312 and other electrically conductive patterns 313 to each other, a thin dielectric film 317_1 formed between the copper patterns 312, another thin dielectric film 317_2 formed between the copper patterns 313, a protective layer 315 for covering predetermined parts of the top surfaces of the copper patterns 312 and the dielectric film 317_1, and another protective layer 316 covering predetermined parts of the top surfaces of the copper patterns 313 and the dielectric film 317_2.

A part of the copper pattern 312 electrically connected to the conductive wire 330 is referred to as a bond finger. A part of the copper pattern 313, to which the solder ball 350 is fused, is called as a ball land. A nickel (Ni)/gold (Au) plating layer 319_1 is formed at the bond finger and another nickel (Ni)/gold (Au) plating layer 319_2 is formed at the ball land. Of course, the protective layers 315 and 316 do not cover the ball lands and the bond finger, in order to perform the wire bonding process and the fusing process. Also, the nickel (Ni)/gold (Au) plating layers are not formed at the sides of the bond fingers and ball lands.

The thin dielectric films 317_1 are formed between the copper patterns 312. The height of the thin dielectric film 317_1 is the same as that of the copper pattern 312. Also, other thin dielectric films 317_2 are formed between the copper patterns 313. The height or the thickness of the thin dielectric film 317_2 is the same as that of the copper pattern 313. That is, the surfaces of the thin dielectric films 317_1 and 317_2 are flushed with the surfaces of the copper patterns 312 and 313. The material of the thin dielectric films 317_1 and 317_2 may be a conventional epoxy resin or its equivalent. However, the present invention is not limited to any material of the dielectric film. Also, the protective layers 315 and 316 of a predetermined thickness are formed at the surfaces of the dielectric films 317_1 and 317_2 and the copper patterns 312 and 313, which form the same plane. Since any winding or step height between the dielectric films 317_1 and 317_2 and the copper patterns 312 and 313 does not exist, the surfaces of the protective layers 315 and 316 are formed in the same plane, thereby creating a superior evenness.

Of course, the protective layers 315 and 316 are not formed at the ball lands or the bond finger. Thus, the connection of the conductive wires or the fusion of the solder balls 350 is not effected.

The semiconductor die 320 is bonded to a center area of the top surface of the substrate 310 by means of an adhesive 321. Since the protective layer 315 having a superior even surface is formed at the bottom surface of the semiconductor die 320, the semiconductor die 320 having a very delicately even surface is strongly bonded to the surface of the protective layer 315.

The semiconductor die 320 and the bond fingers of the electrically conductive patterns 312 of the substrate 310 are electrically connected to each other by means of the conductive wires 330.

The encapsulant 340 covers the semiconductor die 320 located at the top surface of the substrate 310 as well as the conductive wires 330, so as to protect them from the external environment. The encapsulant 340, as described above, is formed in such a manner that the substrate 310 is located at a bottom mold, as well a top mold having a cavity, which is formed at a region corresponding to the semiconductor die 320 and the conductive wires 330, presses down on the top surface of the substrate 310 (the protective layer 315 located on the outside of the encapsulant 340), and then the encapsulant possessing high temperature and pressure is injected into the cavity. At this time, since the protective layer 315 compressed by the top mold has an excellent even surface, the crack of the protective layer 315 or the crack of the copper pattern 312 located at the protective layer 315 does not occur.

The solder balls 350 are fused to the ball lands, which are exposed to the lower part of the substrate through the protective layer 316 formed at the bottom surface of the substrate 310.

Here, the thin dielectric film 317_1 and the even protective layer 315 may be formed on only the top surface of the resin layer 311.

Figure 4A:
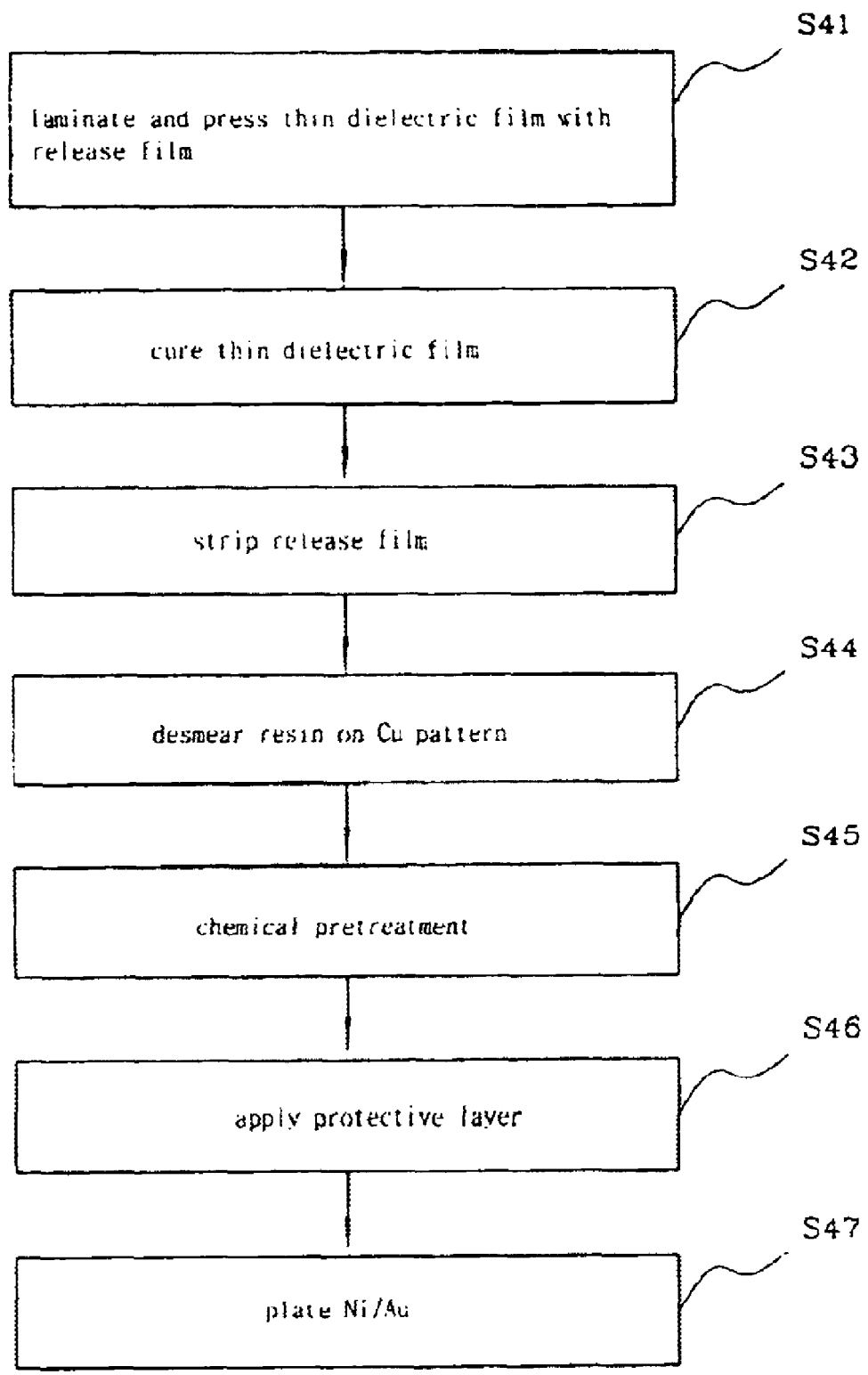
FIG. 4A is a flow chart showing one fabrication method of a printed circuit board for a semiconductor package according to another embodiment of the present invention.
Figure 4B:
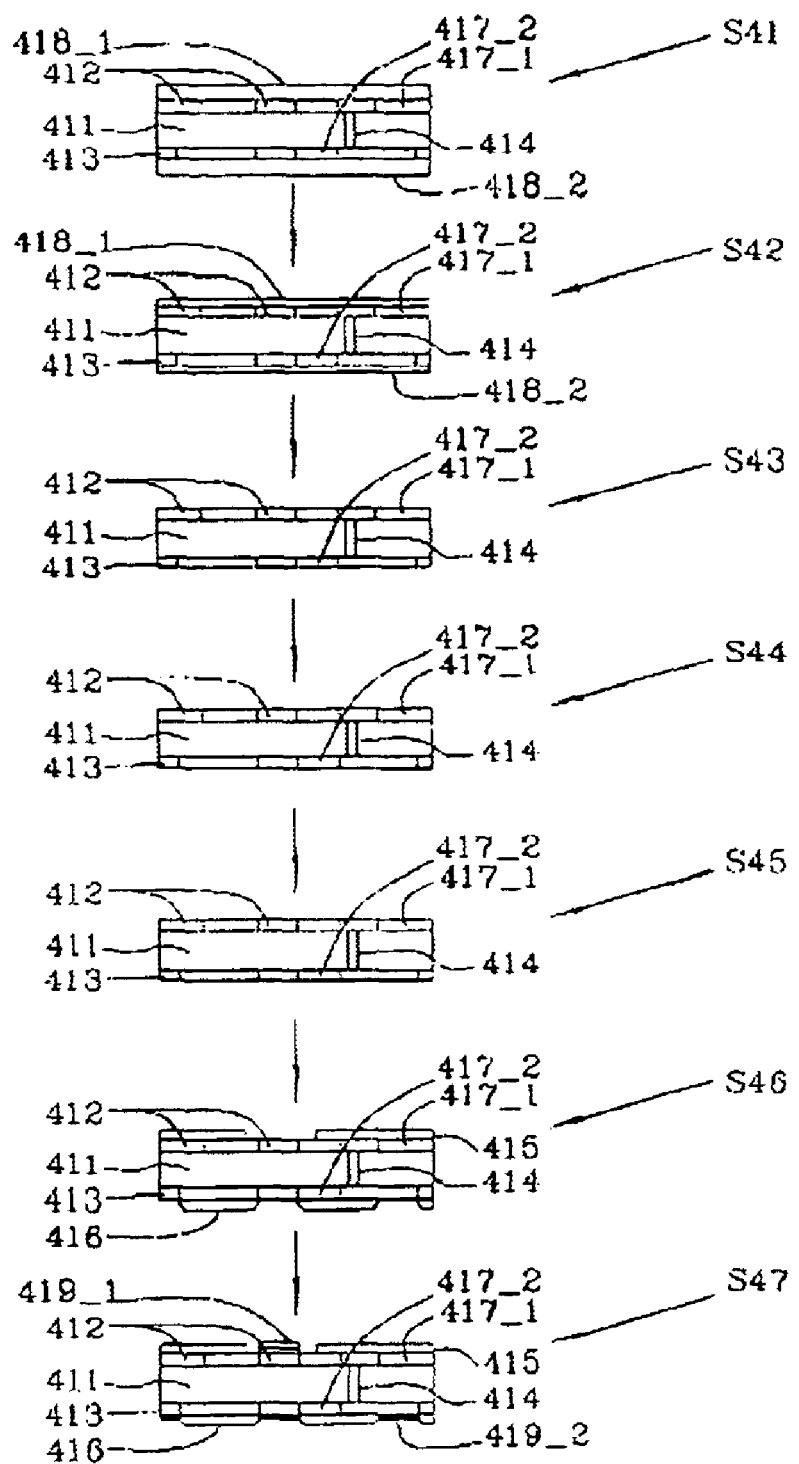
FIG. 4B is a schematic sectional view of the printed circuit board of FIG. 4A.

Referring to FIG. 4A, a flow chart showing one fabrication method of a printed circuit board for a semiconductor package according to another embodiment of the present invention is illustrated. Referring to FIG. 4B, a schematic sectional view of the printed circuit board of FIG. 4A is illustrated.

As shown in the drawings, a fabrication method includes a laminating and pressing step S41 of thin dielectric films 417_1 and 417_2 having release films 418_1 and 418_2, thin dielectric films 417_1 and 417_2 hardening step S42, release films 418_1 and 418_2 eliminating step S43, a resin eliminating step S44 on copper patterns, a chemical pretreatment step S45, protective layers 415 and 416 forming step S46 and nickel (Ni)/gold (Au) plating layers 419_1 and 419_2 forming step S47.

The laminating and pressing step S41 of thin dielectric films 417_1 and 417_2 having release films 418_1 and 418_2 and the thin dielectric films 417_1 and 417_2 having release films 418_1 and 418_2 are laminated on the top and bottom surfaces of the thermosetting resin layer 411 having the plurality of copper patterns 412 and 413 and then are strongly pressed. The laminating and pressing process of the thin dielectric films 417_1 and 417_2 is continuously carried out until the release films 418_1 and 418_2 are contacted with the copper patterns 412 and 413. That is, the laminating and pressing process is conducted until the thickness of the thin dielectric films 417_1 and 417_2 are the same as that of the copper patterns 412 and 413.

The material of the thin dielectric films 417_1 and 417_2 may be a conventional epoxy resin or its equivalent. However, the present invention is not limited to any material of the dielectric film. Also, it is preferred that the material of the release films 418_1 and 418_2 is a conventional insulating film, in order to easily separate it from the thin dielectric films 417_1 and 417_2.

Continuously, in the thin dielectric films 417_1 and 417_2 hardening step S42, the thin dielectric films 417_1 and 417_2 are cured at the temperature range of approximately 100~200° C. for approximately 30~60 minutes in order for it to be hardened.

Successively, in the release films 418_1 and 418_2 eliminating step S43, the release films 418_1 and 418_2 are stripped from the dielectric films 417_1 and 417_2.

On succession, in the resin eliminating step S44 on copper patterns, the resin residue left over from the surfaces of the copper patterns 412 and 413 is eliminated by means of a desmearing chemical. The material of the desmearing chemical may be made of a potassium permanganate or its equivalent. However, the present invention is not limited to any material of the desmearing chemical.

Continuously, in the chemical pretreatment step S45, a chemical solution such as a formic acid or a hydrogen carboxylic acid is pretreated on the surfaces of the dielectric films 417_1 and 417_2 and the electrically conductive patterns 412 and 413, in order to improve the bonding force with the protective layers 415 and 416, during printing of the protective layer in the future.

Successively, in the protective layers 415 and 416 forming step S46, the protective layers 415 and 416 of a predetermined thickness are applied and developed on the surfaces of the electrically conductive patterns 412 and 413 except for bond fingers and ball lands and the dielectric films 417_1 and 417_2. The surfaces of the electrically conductive patterns 412 and 413 and the dielectric films 417_1 and 417_2, to which the protective layers 415 and 416 are applied, are formed in the same plane. Accordingly, the surfaces of the protective layers 415 and 416 have a superior evenness.

Finally, in the nickel (Ni)/gold (Au) plating layers 419_1 and 419_2 forming step S47, the surfaces of the ball lands and the bond fingers, which is exposed to outside through the protective layers, are sequentially plated with nickel/gold (Ni/Au). Here, since only the top surfaces of the bond fingers and ball lands are exposed through the protective layers 415 and 416 and the side surfaces thereof are not exposed by the dielectric films 417_1 and 417_2, the nickel (Ni)/gold (Au) plating layers 419_1 and 419_2 are formed on only top surfaces of the bond fingers and ball lands. Accordingly, it is a very ideal plating structure, because the bonding force between the plating layers 419_1 and 419_2 and the protective layers 415 and 416 or the dielectric films 417_1 and 417_2 is very weak.

Figure 5A:
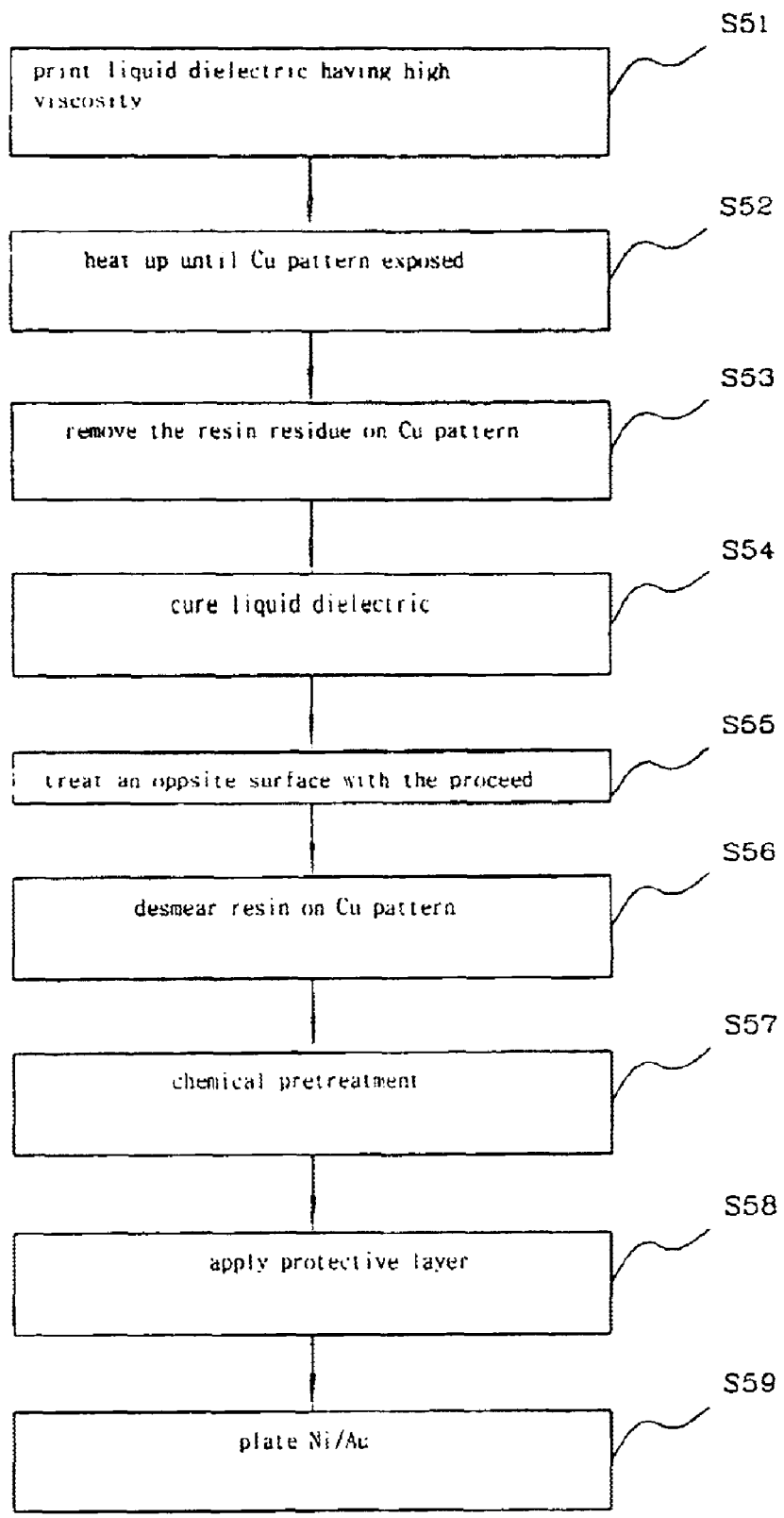
FIG. 5A is a flow chart showing another fabrication method of a printed circuit board for a semiconductor package according to another embodiment of the present invention.
Figure 5B:
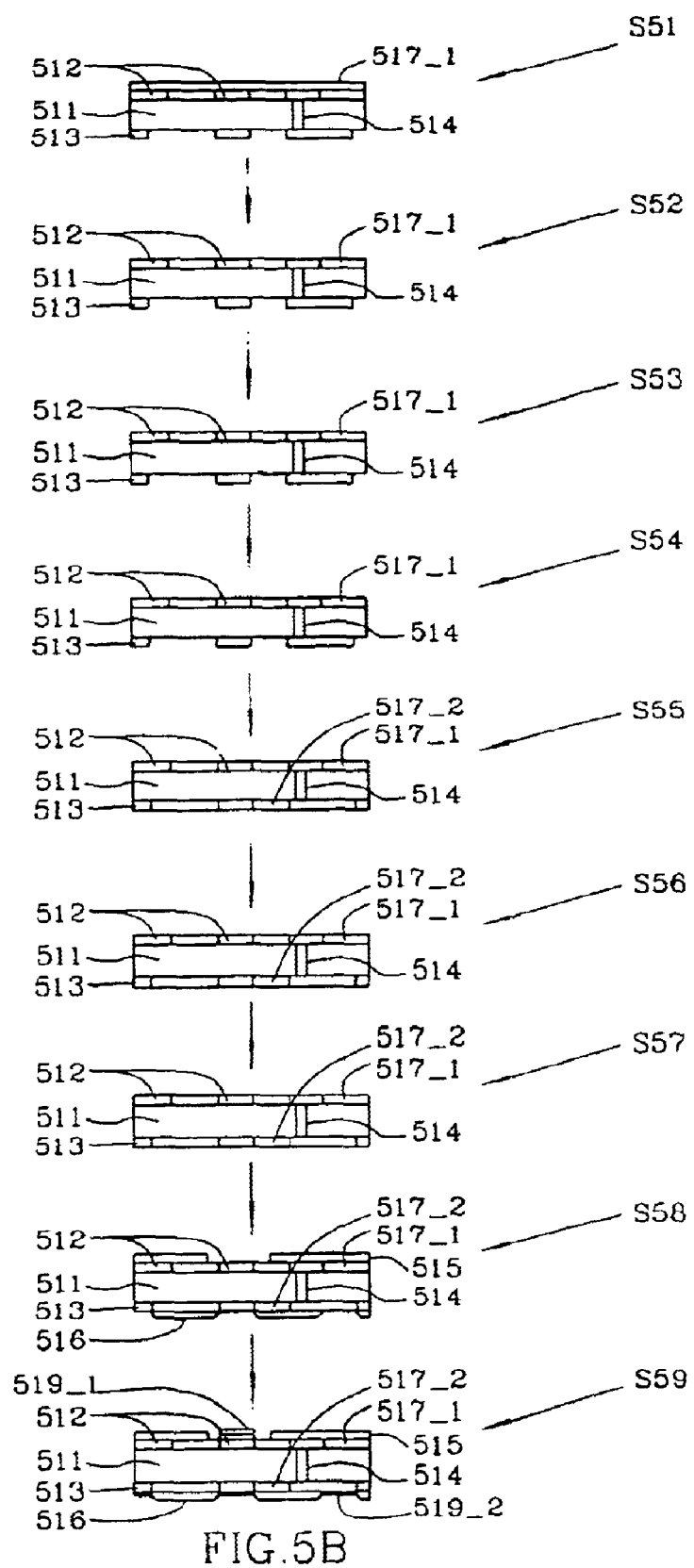
FIG. 5B is a schematic sectional view of the printed circuit board of FIG. 5A.

Referring to FIG. 5A, a flow chart showing another fabrication method of a printed circuit board for a semiconductor package according to another embodiment of the present invention is illustrated. Referring to FIG. 5B, a schematic sectional view of the printed circuit board of FIG. 5A is illustrated.

As shown in the drawings, a fabrication method includes a printing step S51 of a liquid dielectric 517_1 having high viscosity, a heating step S52, a resin residue eliminating step S53, a hardening step S54, a step S55 for treating an opposite surface thereof with the proceeding steps, a resin eliminating step S56 on copper patterns, a chemical pretreatment step S57, protective layers 515 and 516 forming step S58 and nickel (Ni)/gold (Au) plating layers 519_1 and 519_2 forming step S59.

Firstly, in the printing step S51 of a liquid dielectric having high viscosity, the liquid dielectric 517_1 having high viscosity is printed on one surface, for example, a top surface of a thermosetting resin layer 511 having the plurality of copper patterns 512. At this time, it is preferred that the thickness of the liquid dielectric 517_1 is slightly thicker than that of the electrically conductive pattern 512.

The material of the liquid dielectric 517_1 having a high viscosity may be a conventional epoxy resin or its equivalent. However, the present invention is not limited to any material of the liquid dielectric 517_1.

Continuously, in the heating step S52, the thermosetting resin layer 511 is heated at the temperature range of 50~150° C. The heating time lasts until the surfaces of the copper patterns 512 and 513 are exposed through a self leveling, that is due to a lowering of viscosity of the liquid dielectric 517_1.

Successively, in the resin residue eliminating step S53, the resin residue left over from the surfaces of the copper patterns 512 and 513 is eliminated, after the heating process. Here, the resin residue is eliminated in such a way that the resin residue on the surface of the copper patterns is scrapped by a conventional knife.

On succession, in the hardening step S54, the liquid dielectric 517_1 is cured at the temperature range of approximately 150~200° C. for approximately 30~60 minutes in order that it be hardened.

Continuously, in step S55 for treating an opposite surface thereof with the proceeding steps, the printing step S51 of a liquid dielectric 517_2 having a high viscosity, the heating step S52, the resin residue eliminating step S53 and the hardening step S54 are all applied to the bottom surface of the thermosetting resin layer 511 as it is.

On succession, in the resin eliminating step S56, the resin residue left over from the surfaces of the copper patterns 512 and 513 is eliminated by means of the desmearing chemical. The material of the desmearing chemical may be a potassium permanganate or its equivalent. However, the present invention is not limited to any material of the desmearing chemical.

Continuously, in the chemical pretreatment step S57, a chemical solution such as a formic acid or a hydrogen carboxylic acid is pretreated on the surfaces of the dielectric 517_1 and 517_2 and the electrically conductive patterns 512 and 513, in order to improve the bonding force with the protective layers 515 and 516, during printing of the protective layer in the future.

Successively, in the protective layers 615 and 516 forming step S58, the protective layers 515 and 516 of a predetermined thickness are applied and developed on the surfaces of the electrically conductive patterns 512 and 513 excepting for bond fingers and ball lands and the dielectrics 517_1 and 517_2. The surfaces of the electrically conductive patterns 512 and 513 and the dielectrics 517_1 and 517_2, to which the protective layers 515 and 516 are applied, are formed in the same plane. Accordingly, the surfaces of the protective layers 515 and 516 have a superior evenness.

Finally, in the nickel (Ni)/gold (Au) plating layers 519_1 and 519_2 forming step S59, the surfaces of the ball lands and the bond fingers, which is exposed to outside through the protective layers 515 and 516, are sequentially plated with nickel/gold (Ni/Au). Here, since only the top surfaces of the bond fingers and ball lands are exposed through the protective layers 515 and 516 and the side surfaces thereof are not exposed by the dielectrics 517_1 and 517_2, the nickel (Ni)/gold (Au) plating layers 519_1 and 519_2 are formed at only top surfaces of the bond fingers and ball lands.

Here, the dielectric 517_1 and the even protective layer 515 may be formed on only the top surface of the resin layer 511.

Figure 6A:
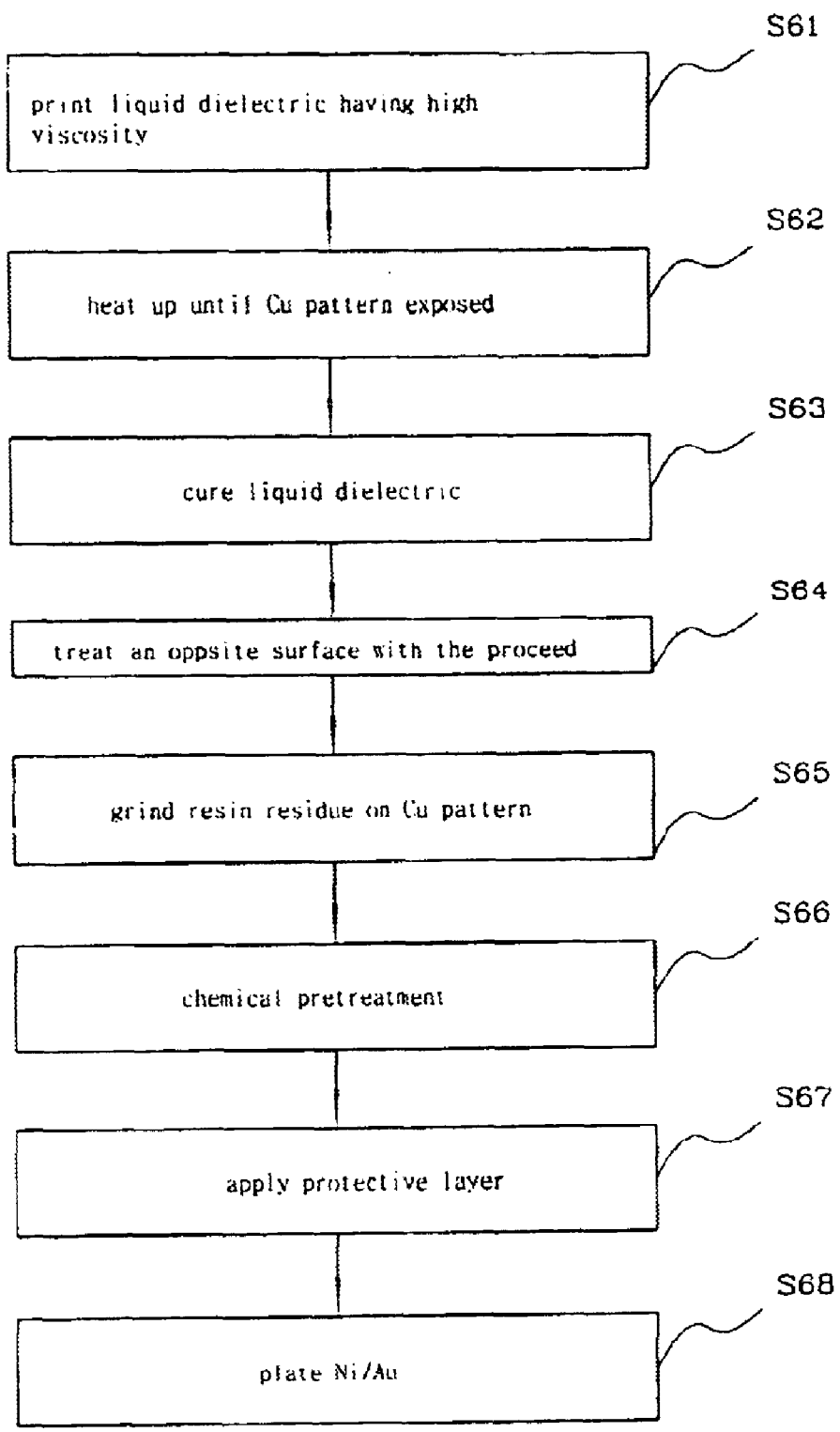
FIG. 6A is a flow chart showing a fabrication method of another further printed circuit board for a semiconductor package according to another embodiment of the present invention.
Figure 6B:
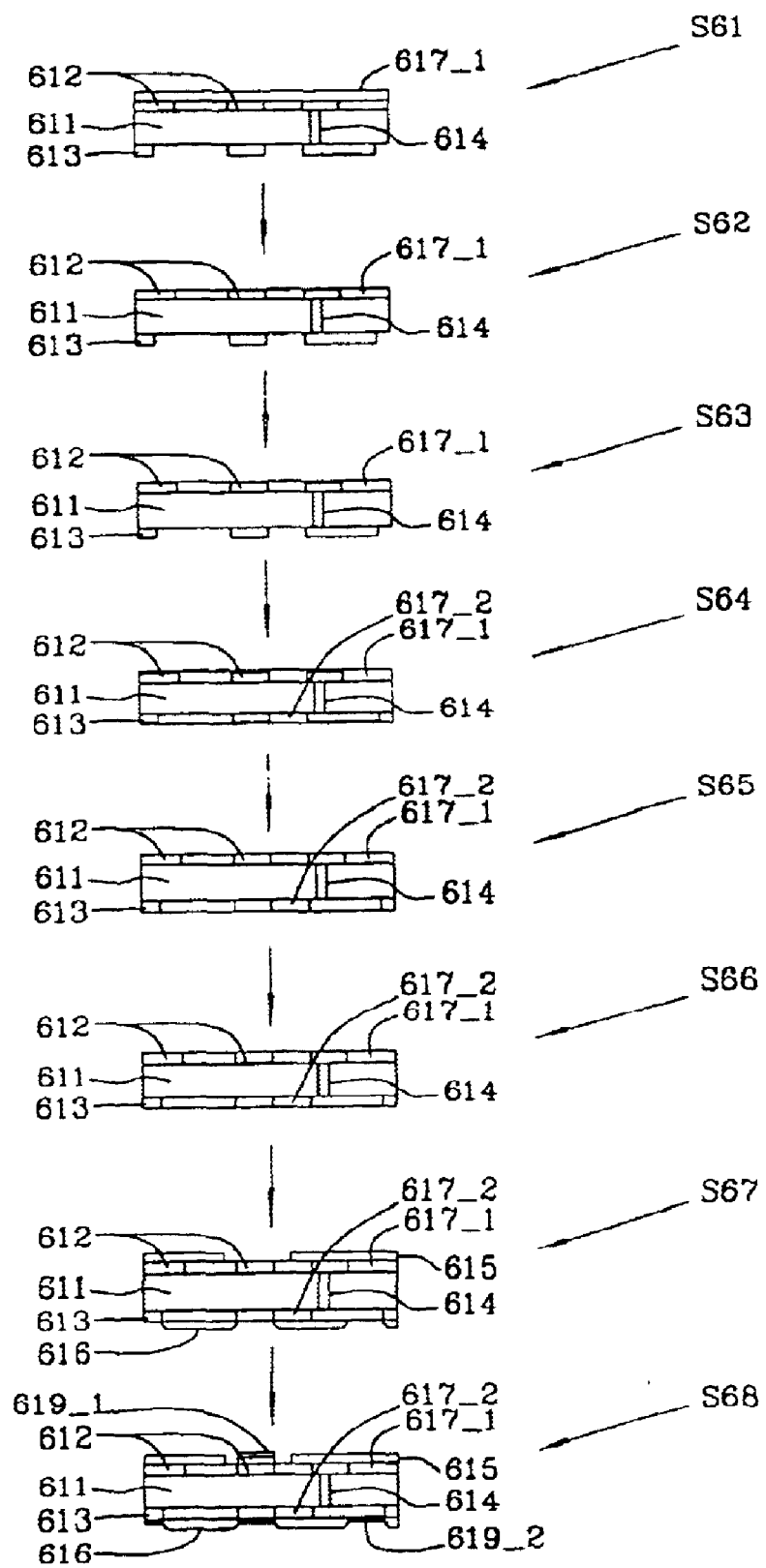
FIG. 6B is a schematic sectional view of the printed circuit board of FIG. 6A.

Referring to FIG. 6A, a flow chart showing another further fabrication method of a printed circuit board for semiconductor package according to another embodiment of the present invention is illustrated. Referring to FIG. 6B, a schematic sectional view of the printed circuit board of FIG. 6A is illustrated.

As shown in the drawings, a fabrication method includes a printing step S61 of a liquid dielectric 617_1 having high viscosity, a heating step S62, a hardening step S63, a step S64 of treating an opposite surface thereof with the proceeding steps, a grinding step S65, a chemical pretreatment step S66, protective layers 615 and 616 forming step S67 and nickel (Ni)/gold (Au) plating layers 619_1 and 619_2 forming step S68.

In the a printing step S61 of a liquid dielectric having a high viscosity, the liquid dielectric 617_1 having a high viscosity is printed on one surface, for example, a top surface of a thermosetting resin layer 611 having the plurality of copper patterns 612. At this time, it is preferred that the thickness of the liquid dielectric 617_1 is slightly thicker than that of the electrically conductive pattern 612.

The material of the liquid dielectric 617_1 having high viscosity may be a conventional epoxy resin or its equivalent. However, the present invention is not limited to any material of the liquid dielectric 617_1.

Continuously, in the heating step S62, the thermosetting resin layer 611 is heated at the temperature range of 50~150° C. The heating time lasts until the surfaces of the copper patterns 612 and 613 are exposed through a self-leveling, that is due to a lowering of viscosity of the liquid dielectric 617_1.

On succession, in the hardening step S63, the liquid dielectric 617_1 is cured at the temperature range of approximately 150~200° C. for approximately 30~60 minutes in order that it be hardened.

Continuously, in the step S64 of treating an opposite surface thereof with the proceeding steps, the printing step S61 of a liquid dielectric 617_2 having high viscosity, the heating step S62, and the hardening step S63 are applied to the bottom surface of the thermosetting resin layer 611 in it's present state.

Successively, in the grinding step S65, the resin residue left over from the top and bottom surfaces of the copper patterns 612 and 613 is grinded by a brush.

Continuously, in the chemical pretreatment step S66, a chemical solution such as a formic acid or a hydrogen carboxylic acid is pretreated on the surfaces of the dielectric 617_1 and 617_2 and the electrically conductive patterns 612 and 613, in order to improve the bonding force with the protective layers 615 and 616, during printing of the protective layer in the future.

Successively, in the protective layers 615 and 616 forming step S67, the protective layers 615 and 616 of a predetermined thickness are applied and developed on the surfaces of the electrically conductive patterns 612 and 613 except for the bond fingers and ball lands and the dielectrics 617_1 and 617_2. The surfaces of the electrically conductive patterns 612 and 613 and the dielectrics 617_1 and 617_2, to which the protective layers 615 and 616 are applied, are formed in the same plane. Accordingly, the surfaces of the protective layers 615 and 616 have a superior evenness.

Finally, in the nickel (Ni)/gold (Au) plating layers 619_1 and 619_2 forming step S68, the surfaces of the ball lands and the bond fingers, which are exposed to outside through the protective layers 615 and 616, are sequentially plated with nickel/gold (Ni/Au). Here, since only the top surfaces of the bond fingers and ball lands are exposed through the protective layers 615 and 616 and the side surfaces thereof are not exposed by the dielectrics 617_1 and 617_2, the nickel (Ni)/gold (Au) plating layers 619_1 and 619_2 are formed on only the top surfaces of the bond fingers and ball lands.

The dielectric 617_1 and the even protective layer 615 may be formed on only the top surface of the resin layer 611.

Figure 7A:
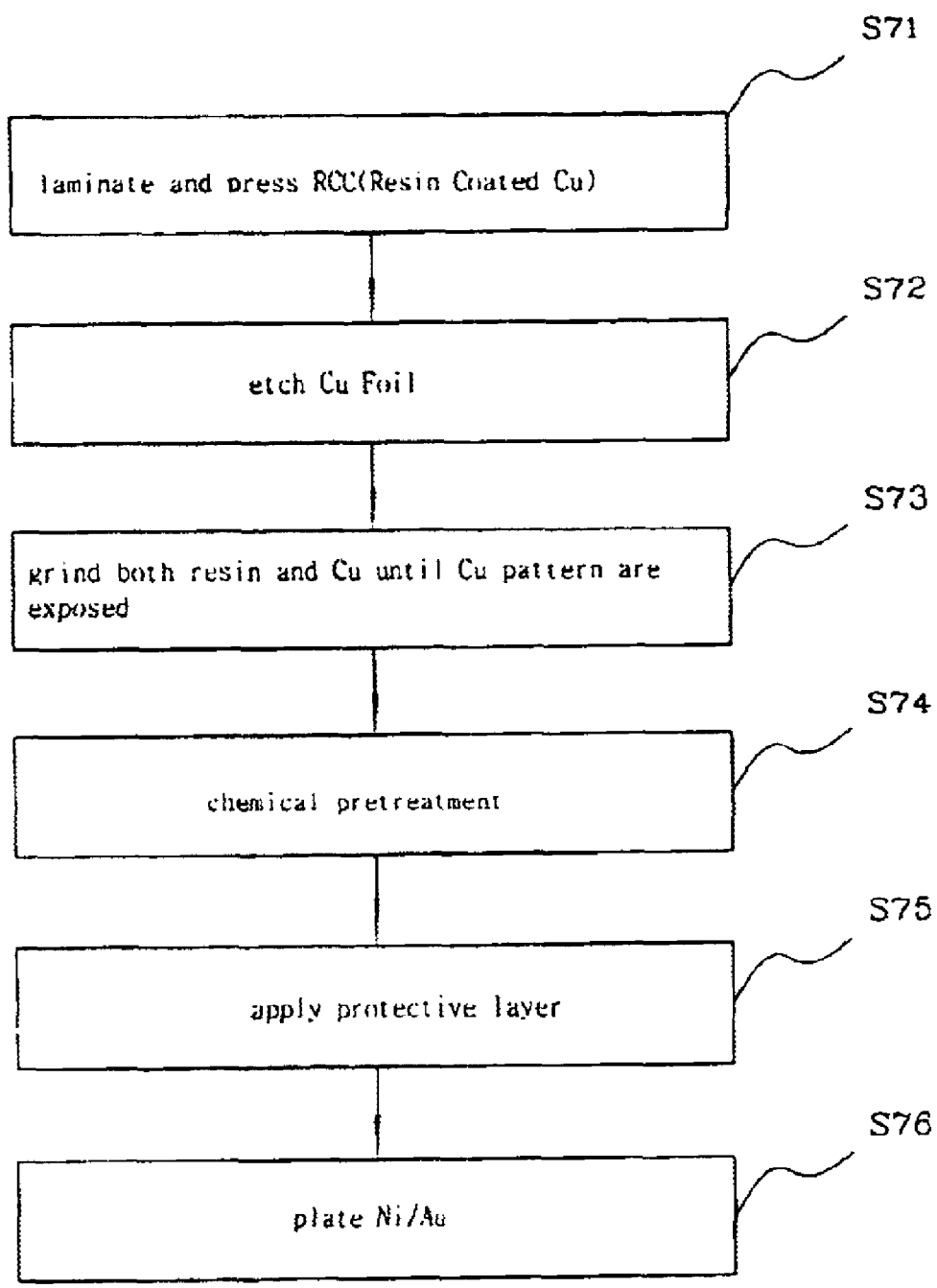
FIG. 7A is a flow chart showing another further fabrication method of a printed circuit board for a semiconductor package according to another embodiment of the present invention.
Figure 7B:
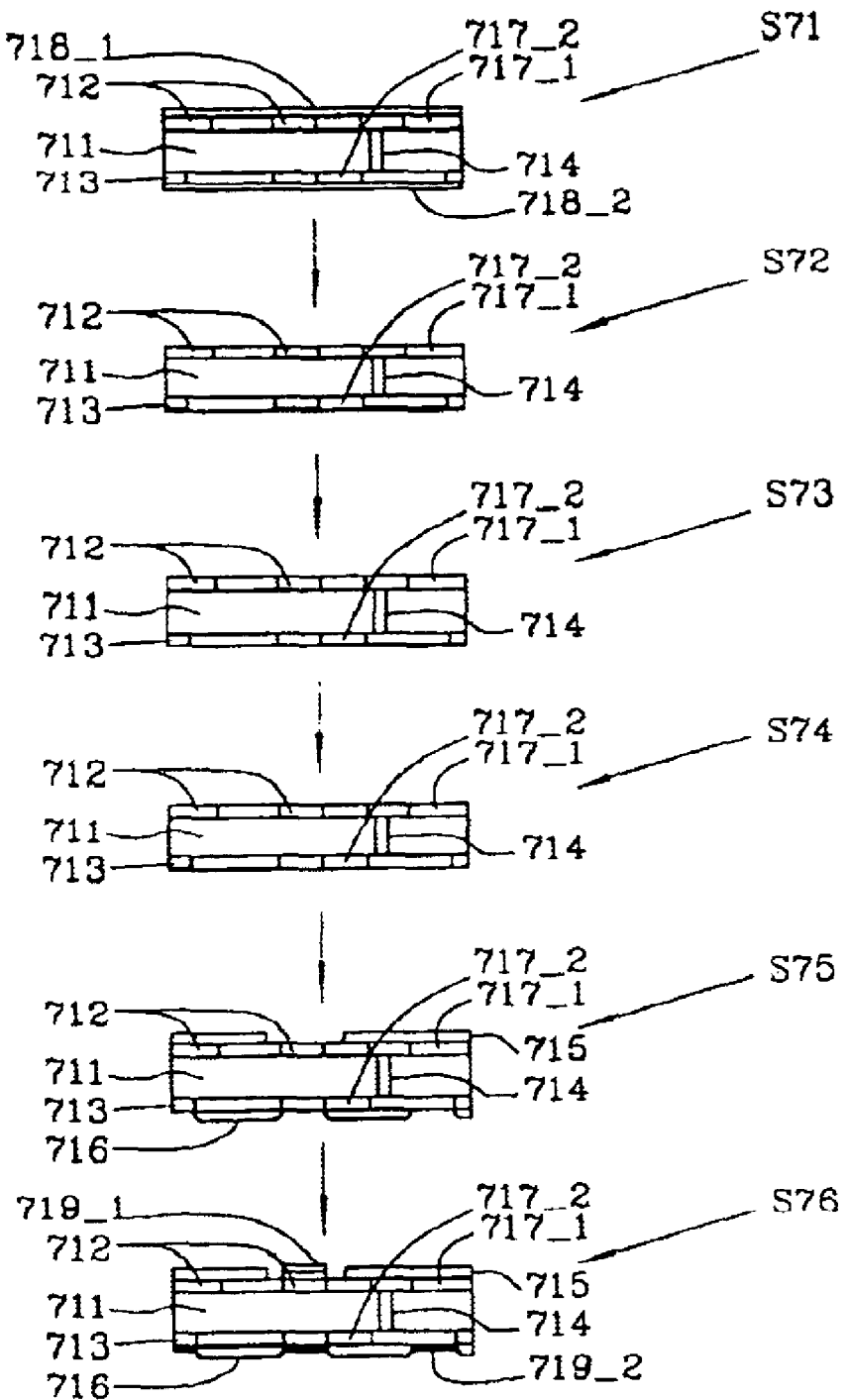
FIG. 7B is a schematic sectional view of the printed circuit board of FIG. 7A.

Referring to FIG. 7A, a flow chart showing another further fabrication method of a printed circuit board for semiconductor package according to another embodiment of the present invention is illustrated. Referring to FIG. 7B, a schematic sectional view of the printed circuit board of FIG. 7A is illustrated.

As shown in the drawings, a fabrication method includes a laminating and pressing step S71 of a Resin Coated Cu (RCC), a copper foils 718_1 and 718_2 etching step S72, a grinding step S73, a chemical pretreatment step S74, protective layers 715 and 716 forming step S75 and nickel (Ni)/gold (Au) plating layers 719_1 and 719_2 forming step S76.

Firstly, in the laminating and pressing step S71 of a RCC, the RCC is laminated on the top and bottom surfaces of the thermosetting resin layer 711 having the plurality of copper patterns 712 and 713, and then are strongly pressed. Here, the RCC includes copper foils 718_1 and 718_2 and dielectric 717_1 and 717_2. The laminating and pressing process of the RCC is continuously carried out until the copper foils 718_1 and 718_2 are almost in contact with the copper patterns 712 and 713. That is, the laminating and pressing process is conducted until the thickness of the dielectric 717_1 and 717_2 are the same as that of the copper patterns 712 and 713.

The material of the dielectric 717_1 and 717_2 may be a conventional epoxy resin or its equivalent. However, the present invention is not limited to any material of the dielectric film.

Continuously, in the copper foils 718_1 and 718_2 etching step S72, the copper foils 718_1 and 718_2 are etched by a predetermined chemical solution or a chemical gas until all of the foils is eliminated.

Successively, in the grinding step S73, both the copper foils and the dielectrics left over the copper patterns 712 and 713 are grinded.

Subsequently, the chemical pretreatment step S74, a chemical solution such as a formic acid or a hydrogen carboxylic acid is pretreated on the surfaces of the dielectric 717_1 and 717_2 and the electrically conductive patterns 712 and 713, in order to improve the bonding force with the protective layers 715 and 716, during printing of the protective layer in the future.

Successively, in the protective layers 715 and 716 forming step S75, the protective layers 715 and 716 of a predetermined thickness are applied and developed on the surfaces of the electrically conductive patterns 712 and 713 excepting for bond fingers and ball lands and the dielectrics 717_1 and 717_2. The surfaces of the electrically conductive patterns 712 and 713 and the dielectrics 717_1 and 717_2, to which the protective layers 715 and 716 are applied, are formed in the same plane. Accordingly, the surfaces of the protective layers 715 and 716 have a superior evenness.

Finally, in the nickel (Ni)/gold (Au) plating layers 719_1 and 719_2 forming step S76, the surfaces of the ball lands and the bond fingers, which is exposed to outside through the protective layers 715 and 716, are sequentially plated with nickel/gold (Ni/Au). Here, since only the top surfaces of the bond fingers and ball lands are exposed through the protective layers 715 and 716 and the side surfaces thereof are not exposed by the dielectrics 717_1 and 717_2, the nickel (Ni)/gold (Au) plating layers 719_1 and 719_2 are formed at only top surfaces of the bond fingers and ball lands.

Here, the dielectric 717_1 and the even protective layer 715 may be formed on only the top surface of the resin layer 711.

This disclosure provides exemplary embodiments of the present invention. The scope of the present invention is not limited by these exemplary embodiments. One who is skilled in the art, in view of this disclosure, whether explicitly provided for or implied by the specification such as variations in structure, dimension, type of material and the manufacturing process, may implement numerous variations.

What is claimed is:

1. A semiconductor package comprising:
a substrate comprising a thermosetting resin layer, a plurality of conductive patterns formed at top and bottom surfaces of the thermosetting resin layer, and protective layers formed on the conductive patterns and the thermosetting resin layer, wherein an outer surface of the protective layers formed on the conductive patterns are approximately a same height as an outer surface of the protective layers formed on the thermosetting resin layer;
a semiconductor die coupled to a top surface of the substrate;
a plurality of conductive wires for electrically coupling the semiconductor die to the conductive patterns; and
an encapsulant for covering the semiconductor die and the conductive wires.

2. A semiconductor package in accordance with claim 1, wherein exposed surfaces of the protective layer is approximately uniformly.

3. A semiconductor package in accordance with claim 1, wherein wire-bond regions of the conductive patterns have plating layers on the surfaces thereof.

4. A semiconductor package in accordance with claim 1, wherein contact fusing regions of the conductive patterns have plating layers on the surfaces thereof.

5. A semiconductor package in accordance with claim 1, wherein thin dielectric films having approximately same thickness as the conductive patterns are formed between the thermosetting resin layer and the protective layers.

6. A semiconductor comprising a thermosetting resin layer, means on top and bottom surfaces of the thermosetting resin layer for forming conductive paths on the substrate, and protective means coated on the means for forming conductive paths and the thermosetting resin layer, wherein the outer surface of the protective layers formed on the conductive paths are approximately the same height as an outer surface of the protective layers formed on the thermosetting resin layer;
a semiconductor die coupled to the top surface of the substrate;
means for electrically coupling the semiconductor die to the means for forming conductive paths on the substrate;
means for covering the semiconductor die and the conductive wires; and
a plurality of contacts coupled to the bottom surfaces of the substrate.

7. A semiconductor package in accordance with claim 6, wherein the protective means having a same height at the surface of the thermosetting resin layer strengthens bonding between the semiconductor die and the protective means.

8. A semiconductor package in accordance with claim 6, wherein the protective means having a same height at the surface of the thermosetting resin layer prevents cracking in the semiconductor package.

9. A semiconductor package in accordance with claim 6, wherein the protective means coated on predetermined regions of the means for forming conductive paths and the thermosetting layer and having a same height at the top surface of the thermosetting resin layer.

10. A semiconductor package comprising:
a substrate having a thermosetting resin layer and a plurality of conductive patterns formed on a first surface of the thermosetting resin layer, a first protective layer formed on the first side of the thermosetting resin layer and the conductive patterns, wherein an outer surface of the protective layer formed on the conductive patterns are approximately coplanar with an outer surface of the protective layer formed on the first side of the thermosetting resin layer;
a semiconductor die coupled to the top surface of the substrate;
a plurality of conductive wires for electrically coupling the semiconductor die to the substrate; and
an encapsulant for covering the semiconductor die and the conductive wires.

11. A semiconductor package in accordance with claim 10 wherein the printed circuit board substrate further comprises:
a plurality of conductive patterns formed on a second surface of the thermosetting resin layer;
a plurality of conductive vias for coupling the conductive patterns formed at the top and bottom surfaces of thermosetting resin layer; and
a second protective layer formed on the second surface of the thermosetting resin layer and the conductive patterns on the second surface, wherein an outer surface of the second protective layer formed on the conductive patterns on the second surface are approximately coplanar with an outer surface of the protective layer formed on the second surface of the thermosetting resin layer.

12. A semiconductor package in accordance with claim 11 further comprising plating layers formed on wire-bond regions of the conductive patterns.

13. A semiconductor package in accordance with claim 11 further comprising plating layers formed on contact fusing regions of the conductive patterns.

14. A semiconductor package in accordance with claim 11 further comprising thin dielectric films having approximately a same thickness as the conductive patterns formed between the thermosetting resin layer and the protective layers.

15. A semiconductor package in accordance with claim 11 wherein the protective layer having a same height at the surface of the thermosetting resin layer prevents cracking in the semiconductor package.

16. A semiconductor package in accordance with claim 11 wherein the protective layer coated on predetermined regions of the conductive patterns and the thermosetting resin layer and having a same height at the top surface of the thermosetting resin layer.

17. A semiconductor package in accordance with claim 10 further comprising an adhesive for coupling the semiconductor die to the printed circuit board substrate.

18. A semiconductor package in accordance with claim 11 further comprising metal plating layers formed on contact fusing regions of the conductive patterns and on contact fusing regions of the conductive patterns.

19. A semiconductor package in accordance with claim 18 wherein the metal plating layers are nickel (Ni)/gold (Au) plating layers.

20. A semiconductor package in accordance with claim 14 wherein the thin dielectric films and the protective layers are formed on the top surface of the thermosetting resin layer.

* * * * *